US011963334B2

(12) United States Patent
Cann et al.

(10) Patent No.: US 11,963,334 B2
(45) Date of Patent: Apr. 16, 2024

(54) HEAT PIPES FOR THERMAL DISSIPATION IN RADAR DEVICES

(71) Applicant: Navico, Inc., Tulsa, OK (US)

(72) Inventors: Michael John Cann, Auckland (NZ);
Simone Giachi, Florence (IT);
Jonathan Andrew George Lambert,
Auckland (NZ)

(73) Assignee: Navico, Inc., Tulsa, OK (US)

( * ) Notice: Subject to any disclaimer, the term of this patent is extended or adjusted under 35 U.S.C. 154(b) by 0 days.

(21) Appl. No.: 17/847,643

(22) Filed: Jun. 23, 2022

(65) Prior Publication Data
US 2023/0301025 A1 Sep. 21, 2023

(30) Foreign Application Priority Data

Mar. 18, 2022 (EP) .................................... 22425012

(51) Int. Cl.
*G01S 7/02* (2006.01)
*H05K 7/20* (2006.01)

(52) U.S. Cl.
CPC .......... *H05K 7/20336* (2013.01); *G01S 7/027* (2021.05); *H05K 7/20309* (2013.01); *H05K 7/20318* (2013.01)

(58) Field of Classification Search
CPC .......... F28D 15/00; F28D 15/02; F28D 15/04; F28D 15/043; F28D 15/046; F28D 15/06;
(Continued)

(56) References Cited

U.S. PATENT DOCUMENTS

| | | | |
|---|---|---|---|
| 2016/0084578 A1* | 3/2016 | Kusuda | F28F 13/003 165/169 |
| 2022/0034690 A1 | 2/2022 | Surineedi | |
| 2022/0236084 A1* | 7/2022 | Krishnan | B60H 1/00271 |

FOREIGN PATENT DOCUMENTS

| | | |
|---|---|---|
| CN | 110 247 149 A | 9/2019 |
| CN | 214 503 887 U | 10/2021 |
| DE | 10 2019 215957 A1 | 4/2021 |

OTHER PUBLICATIONS

Muzyka; "Cooling High-Power Radar Systems: A Thermal Technology Guide;" Military Embedded Systems, Feb. 11, 2022 (Feb. 11, 2022), pp. 1-4; XP055945298; retrieved from the internet: URL: https://militaryembedded.com/radar-ew-thermal-management/cooling-high-powere-radar-systems-a-thermal-technology-guide [retrieved on Jul. 22, 2022].

(Continued)

*Primary Examiner* — Gordon A Jones
(74) *Attorney, Agent, or Firm* — Nelson Mullins Riley & Scarborough LLP

(57) ABSTRACT

A radar device is provided. The radar device includes an antenna and a housing having an exterior wall. The radar device also includes an electronics module having a heat source contained within the housing. Additionally, the radar device includes a heat pipe having a first end and a second end. The first end is positioned proximate to the heat source, and the heat pipe is configured to transfer heat from the first end of the heat pipe to the second end of the heat pipe to reduce an amount of heat at the heat source. The heat pipe may be an evaporator-condenser heat pipe. The second end of the heat pipe may be positioned proximate to a first dissipating feature. The heat source may be a power amplifier, waveguide assembly, printed circuit board, or other electronics, and the first dissipating feature may be the exterior wall of the housing.

17 Claims, 12 Drawing Sheets

(58) Field of Classification Search
CPC ............. F28D 15/0266; F28D 15/0275; F28D 15/0283
See application file for complete search history.

(56) References Cited

OTHER PUBLICATIONS

"How Heat Pipe Technology Works & Applications | FAQ" accessed from https://www.1-act.com/resources/heat-pipe-resources/ on Jun. 22, 2022, all enclosed pages cited.

* cited by examiner

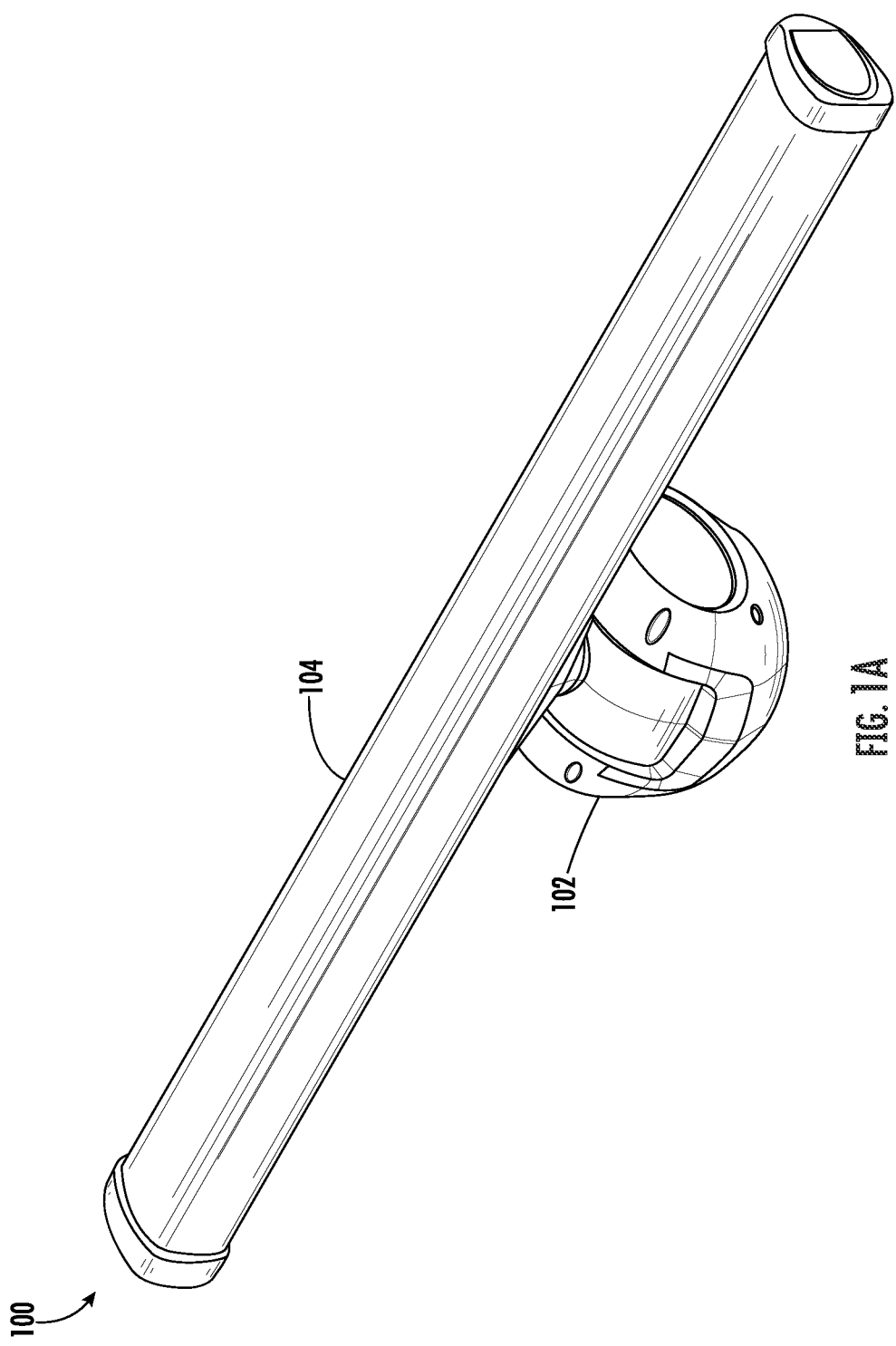

HEAT PIPES FOR THERMAL DISSIPATION IN RADAR DEVICES

CROSS REFERENCE TO RELATED APPLICATIONS

This application claims priority to European Patent Application No. 22425012.6, entitled "Heat Pipes for Thermal Dissipation in Radar Devices", filed on Mar. 18, 2022, which is hereby incorporated by reference in its entirety.

FIELD OF THE INVENTION

Embodiments of the present invention relate generally to heat pipes for use in radar devices to manage the heat generated in radar devices.

BACKGROUND OF THE INVENTION

Within the housing of a radar device, a significant amount of heat is generated. Various components create this heat, including, for example, a waveguide assembly, a power amplifier, printed circuit boards, and other electronics. These heat generating components are often densely packed, so a substantial amount of heat may be generated at specific locations within the housing.

To manage this heat, many attempt to overhaul the design of the housing and its internal components to provide improved heat management. However, such an overhaul is not an option for existing products having heat management issues. Further, due to other possible design constraints, it may be difficult to make significant design changes to address heat management.

Others attempt to use fans or forced airflow to remove heat from hot components by convection, distributing the heat widely within the air within the housing. However, this increase in temperature may generate risks for other sensitive components. Further, fans often possess a short operating life. If a fan were to fail without any backup heat management approaches, the heat generated within the housing may cause premature failure of the radar device or components within the radar device.

BRIEF SUMMARY OF THE INVENTION

Heat pipes provide an effective solution for controlling the amount of heat in the housing of a radar device. Heat pipes of various sizes and geometries may be used to accommodate a housing of a radar device. Heat pipes may provide significantly improved heat reduction at a reduced cost compared to other conductive metals such as aluminum, copper, or graphene. Further, heat pipes may be easily installed and removed from a housing of a radar device. Because of the ease of installation for heat pipes, heat pipes may be retrofitted into existing radar devices. While other heat-exchanger approaches could be used to manage the heat levels in a housing, these approaches typically require changes in the geometry and design of the radar device, the housing, and/or the components within the housing. Heat pipes provide a cost-effective solution for managing the amount of heat within a housing without the need for overhauling the geometry or the design of the housing and its internal components.

In some embodiments, a heat pipe may reduce the temperature at a heat source by 10 degrees Celsius or more as compared to systems without a heat pipe. However, the amount of temperature reduction may vary depending on the size of the heat pipe, the size of the radar device, the difference in temperature at the two ends of the heat pipe, and the number of heat pipes utilized.

Additionally, by utilizing heat pipes, the heat level may be better controlled so that radar devices can be scaled to larger sizes. Without heat pipes or another heat management approach, radar devices may operate at their thermal limit, and this means that the size of the radar device cannot be increased without creating an undue risk of product failure due to the amount of heat generated.

In an example embodiment, a radar device is provided. The radar device includes an antenna, a housing having an exterior wall, and an electronics module having a heat source. The electronics module is enclosed within the housing. The radar device also includes a heat pipe having a first end and a second end. The first end of the heat pipe is positioned proximate to the heat source, and the second end is positioned proximate to a first dissipating feature. The heat pipe is configured to transfer heat from the first end of the heat pipe to the second end of the heat pipe to reduce an amount of heat at the heat source, and the second end of the heat pipe is configured to transfer heat to the first dissipating feature.

In some embodiments, the heat pipe may be an evaporator-condenser heat pipe. The first end of the heat pipe may be provided at a lower elevation than the second end of the heat pipe. The heat pipe may be secured through brazing, through soldering, or by using at least one of a clamp or a magnet. Additionally, in some embodiments, the heat source may include at least one of a power amplifier, a waveguide assembly, a printed circuit board, or a motor.

A second heat pipe may also be provided in some embodiments. Further, in some embodiments, a first heat pipe and a second heat pipe may be provided. The first heat pipe and the second heat pipe may both have a first end and a second end. The first end of the second heat pipe may be positioned proximate to the heat source, and the second end of the second heat pipe may be positioned proximate to a second dissipating feature on an opposite side of the housing as the second end of the first heat pipe. Additional heat pipes may be used to provide further heat management.

In some embodiments, the first dissipating feature may be the exterior wall of the housing, and the second end of the heat pipe may be attached to the exterior wall of the housing. A mounting plate may be connected to the exterior wall of the housing in related embodiments, and the mounting plate may be configured to assist in securing the heat pipe. In related embodiments, the electronics module may have a top surface and a tab extending from the top surface, and the tab may be configured to contact the mounting plate to assist in positioning the electronics module relative to the housing. The housing may be configured to permit the electronics module to shift laterally within the housing until the tab contacts the mounting plate.

In some embodiments, the radar device may also include a waveguide assembly. The waveguide assembly may have a first component and a second component, and an air gap may be defined between the first component and the second component. The second component of the waveguide assembly may be attached to the electronics module, and the electronics module and the second component may be configured to move relative to the first component of the waveguide assembly.

In some embodiments, the radar device may be made in a specified process. The process may include providing the housing and providing the electronics module. The process may also include positioning the electronics module at a desired location. The process may also include providing the heat pipe. The process may also include positioning the first end of the heat pipe proximate to the heat source at the electronics module and also restraining movement of the first end. Additionally, the process may include positioning the second end proximate to the first dissipating feature and restraining movement of the second end.

In another example embodiment, a radar device is provided. The radar device includes a heat source. The radar device also includes a heat pipe that is configured to transfer heat from a first end of the heat pipe to a second end of the heat pipe to reduce an amount of heat at the heat source. The radar device also includes a housing having an exterior wall and a plate connected to the exterior wall. The radar device also includes an electronics module having a tab. The housing is configured to permit the electronics module to shift laterally within the housing until the tab contacts the plate, wherein the tab is configured to contact the plate to assist in positioning the electronics module relative to the housing.

In some embodiments, the radar device may comprise a waveguide assembly having a first component and a second component. An air gap may be defined between the first component and the second component. The second component of the waveguide assembly may be attached to the electronics module, and the electronics module and the second component may be configured to move relative to the first component of the waveguide assembly.

In some embodiments, the electronics module may have a top surface, and the tab may extend from the top surface. In related embodiments, the electronics module may include two or more tabs, wherein the housing may be configured to permit the electronics module to shift laterally within the housing until the two or more tabs contact the plate.

In another example embodiment, a radar device is provided. This radar device may be made by a specified process. This process may include providing a housing and providing an electronics module. The process may also include positioning the electronics module at a desired location. Additionally, the process may include providing a heat pipe, and the heat pipe may have a first end and a second end. The process may include positioning the first end proximate to a heat source at the electronics module and also restraining movement of the first end. Furthermore, the process may include positioning the second end proximate to a first dissipating feature and restraining movement of the second end.

In some embodiments, the first dissipating feature may be the exterior wall of the housing. The housing may have an exterior wall and a mounting plate connected to the exterior wall. Additionally, the electronics module may include a tab, and positioning the electronics module at a desired location may be performed by shifting the electronics module relative to the housing until the tab contacts the mounting plate. In some embodiments, the heat source may include at least one of a power amplifier, a waveguide assembly, a printed circuit board, or a motor.

BRIEF DESCRIPTION OF THE DRAWINGS

Figure 1B:
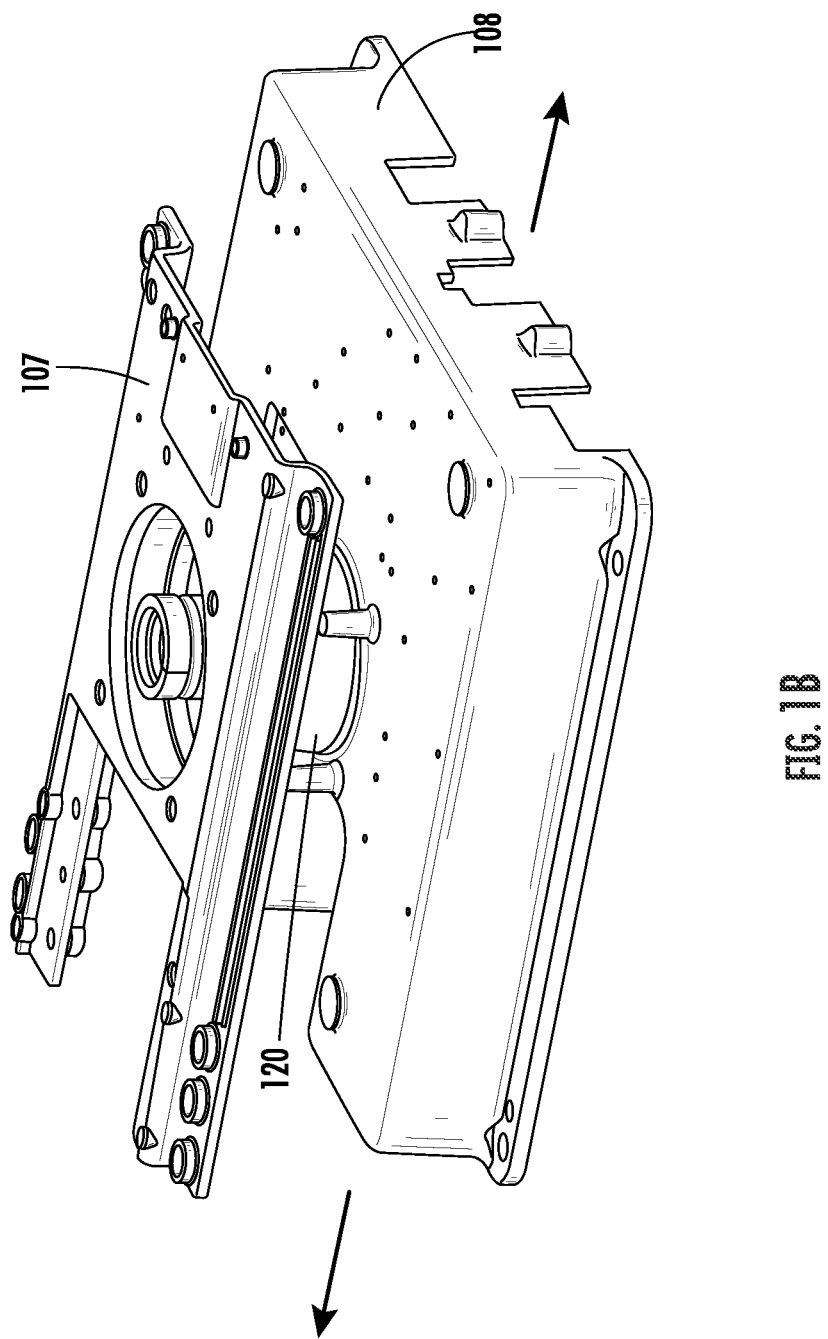
Figure 2A:
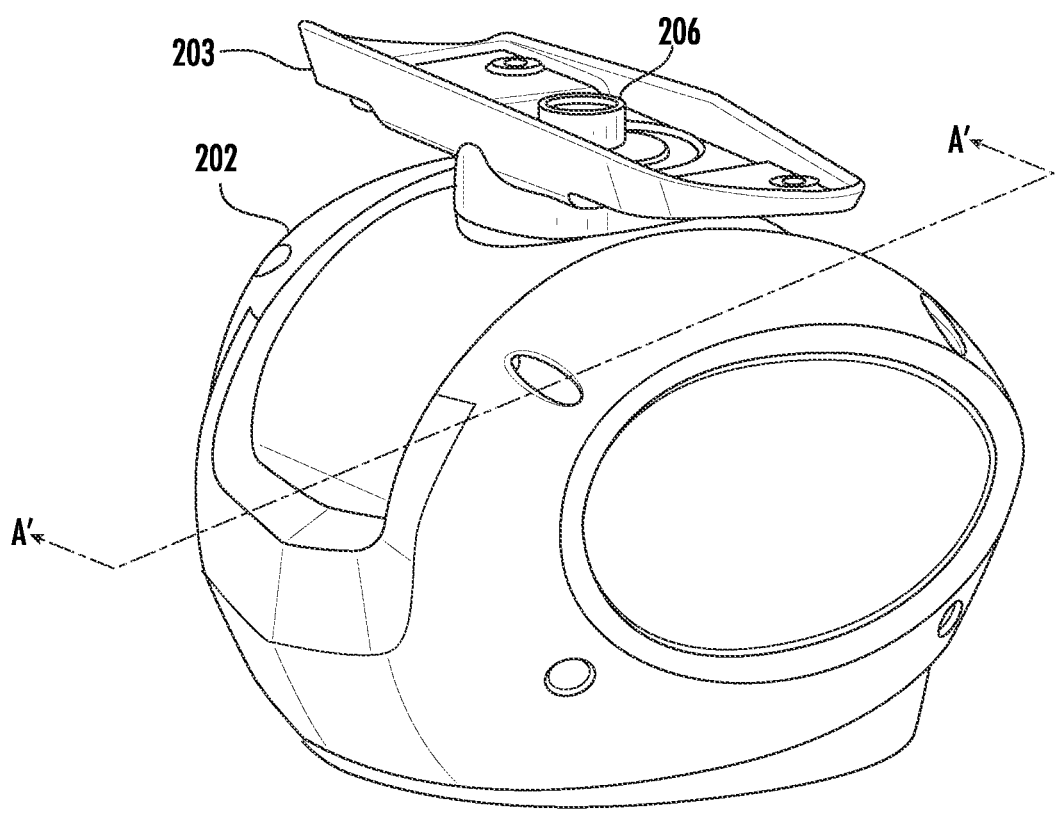
Figure 2B:
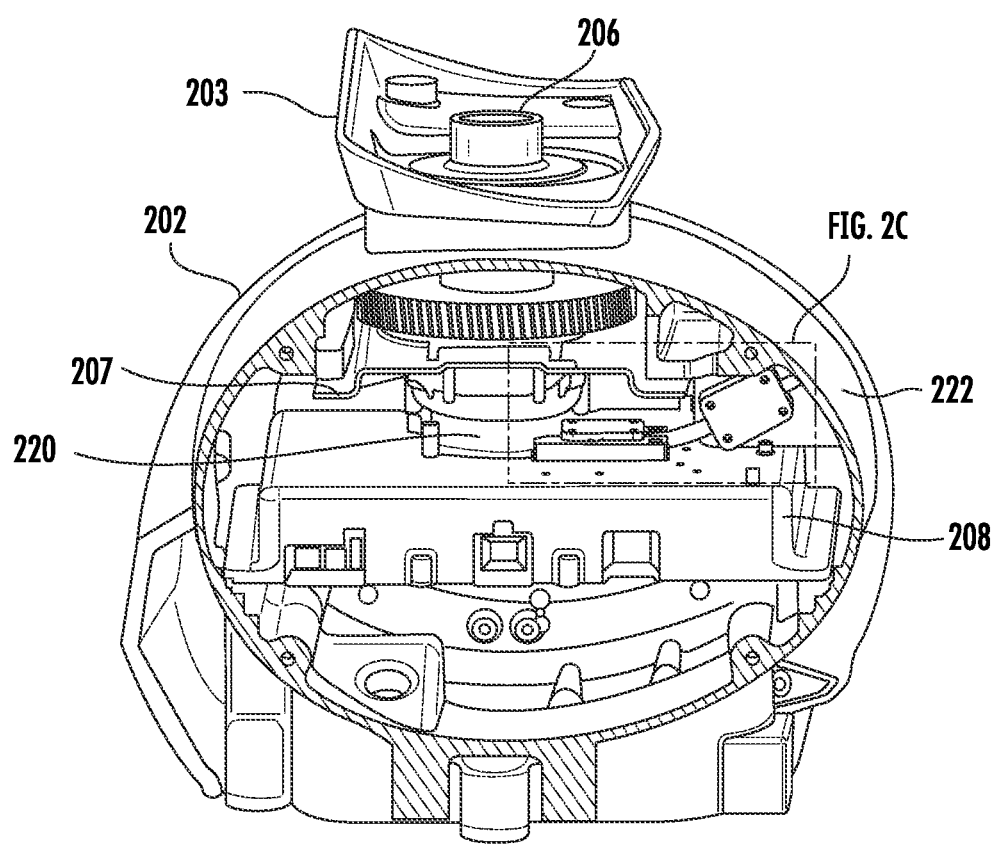
Figure 2C:
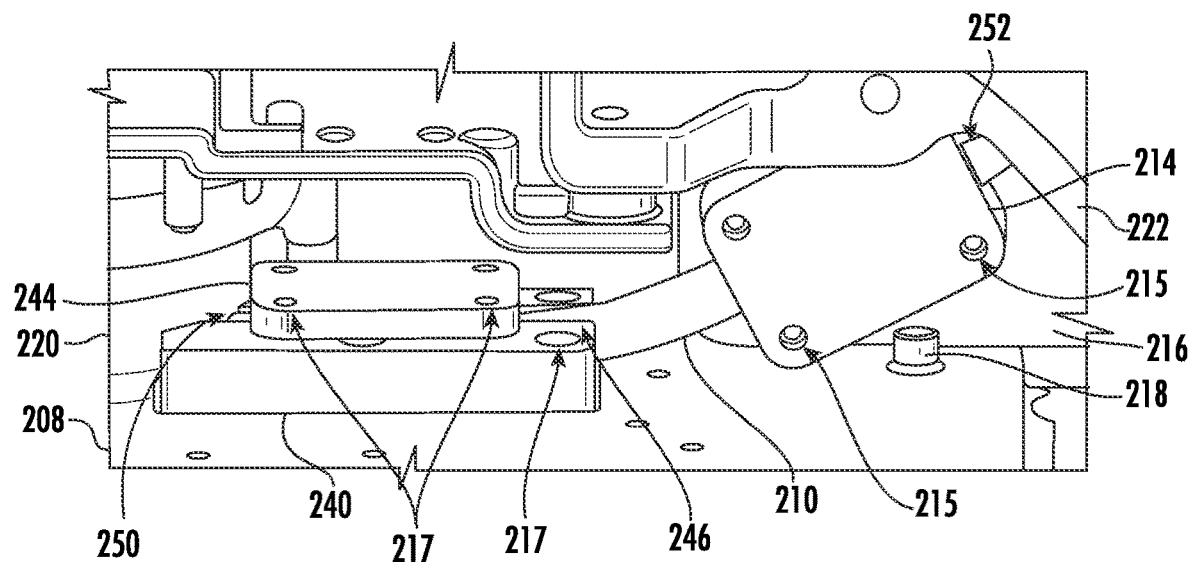
Figure 3:
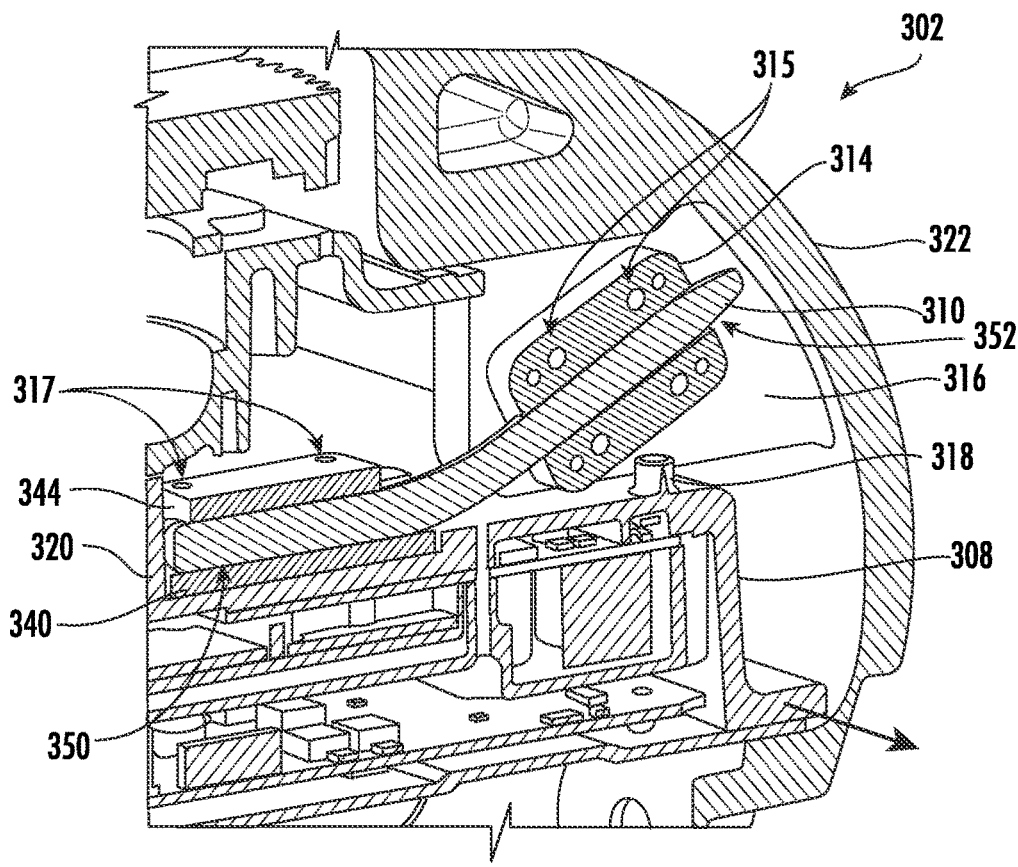
Figure 4A:
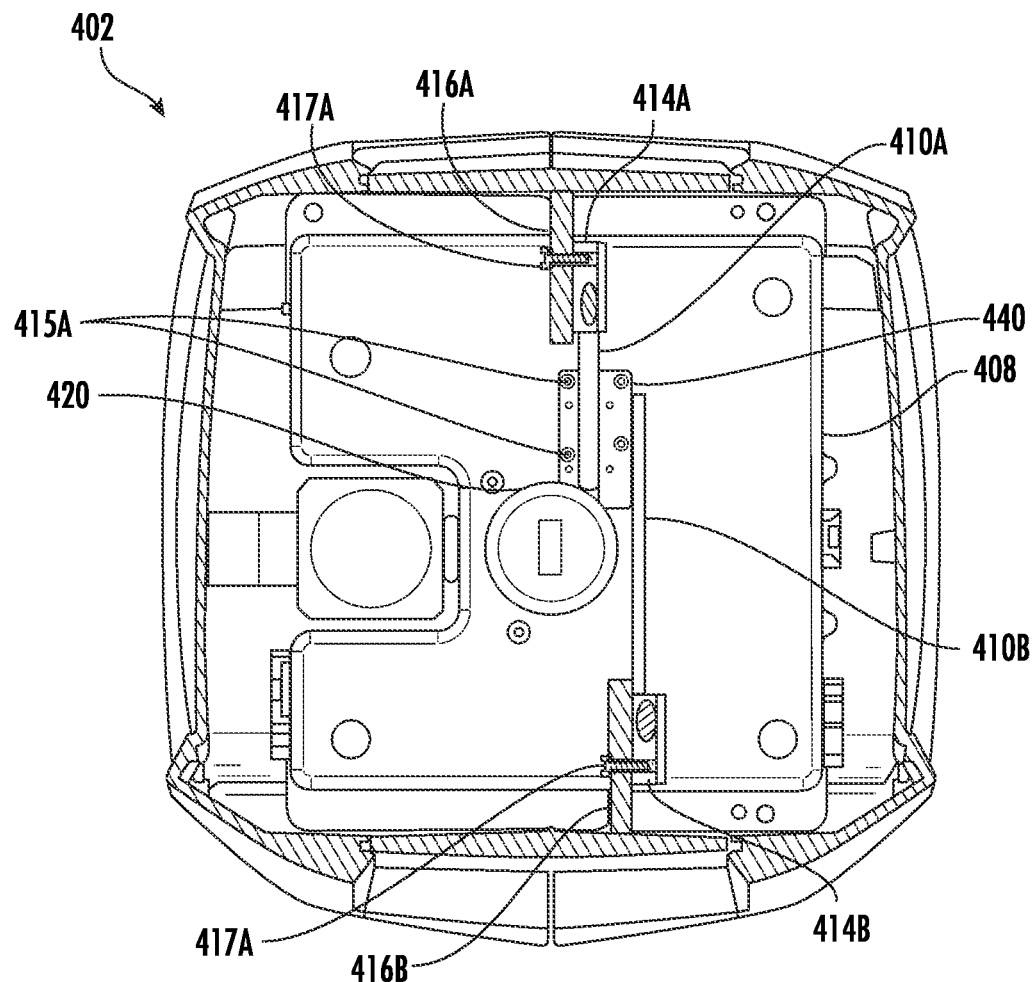
Figure 4B:
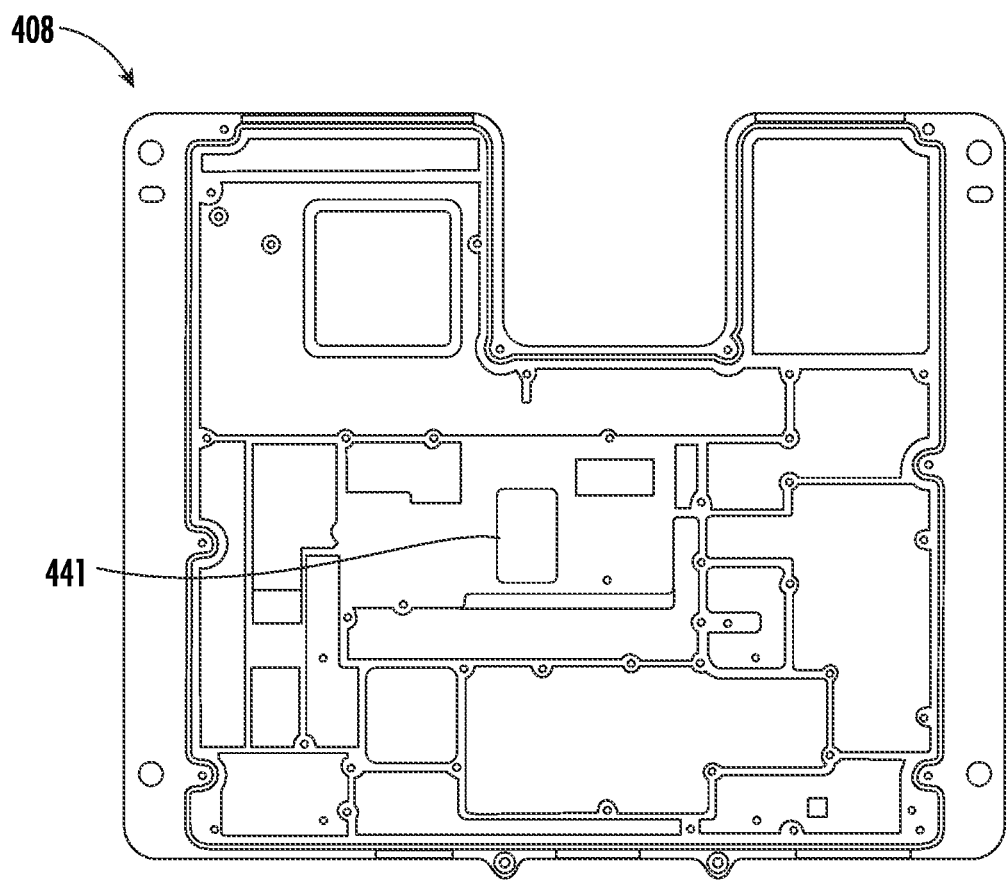
Figure 5:
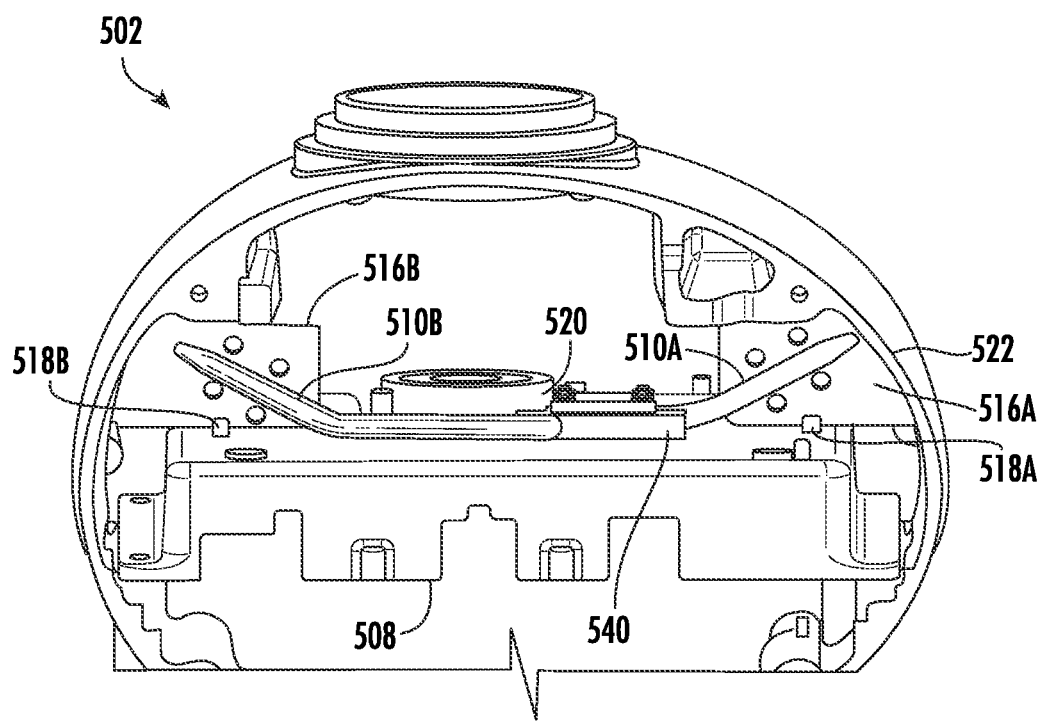
Figure 6A:
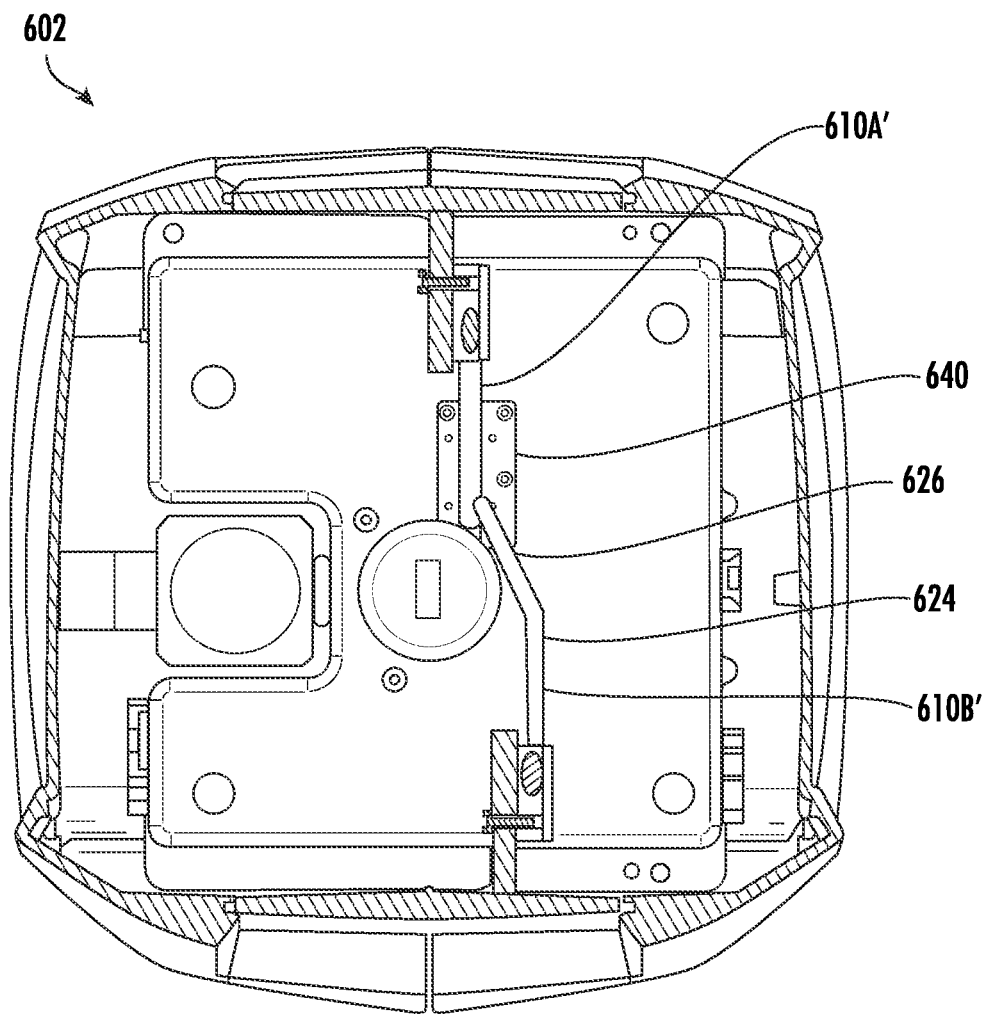
Figure 6B:
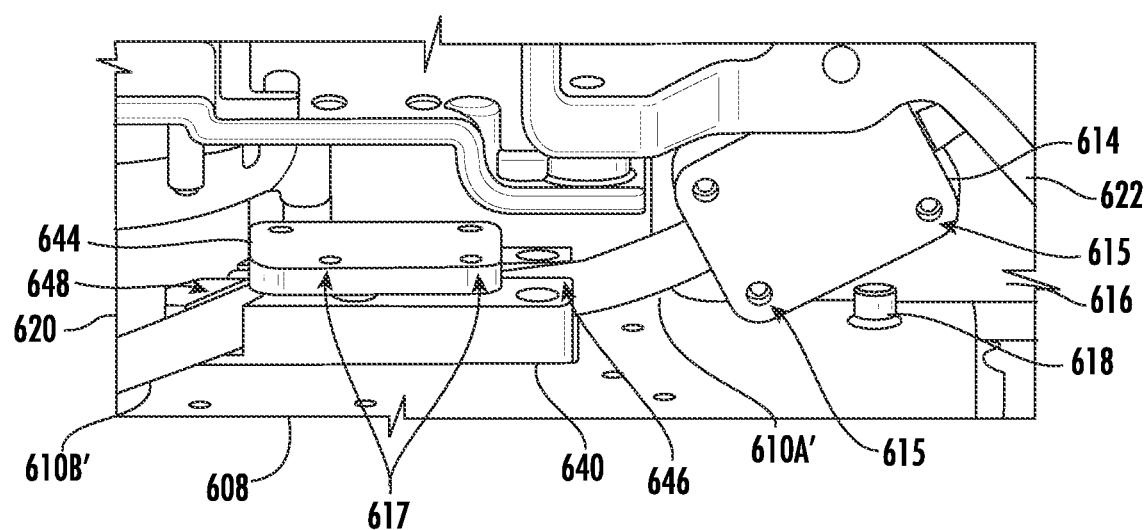
Figure 7:
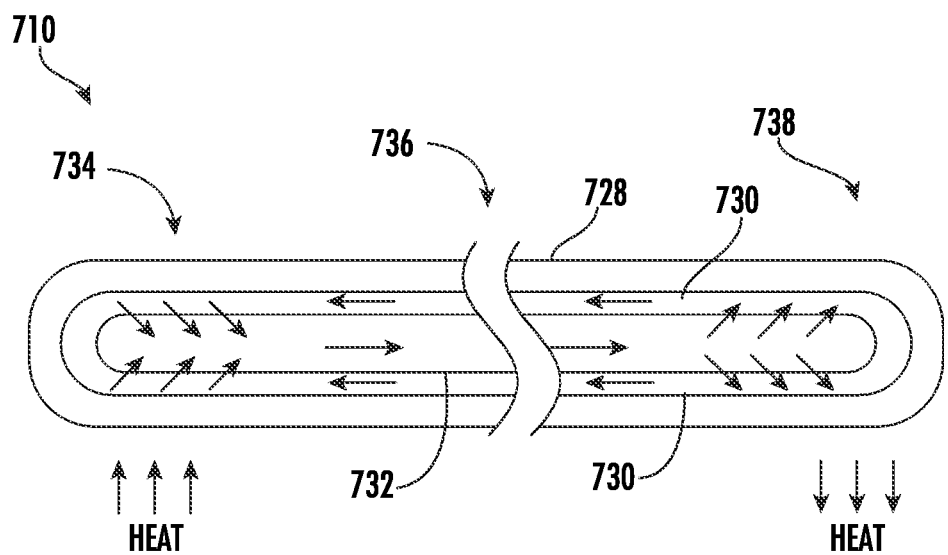
Figure 8:
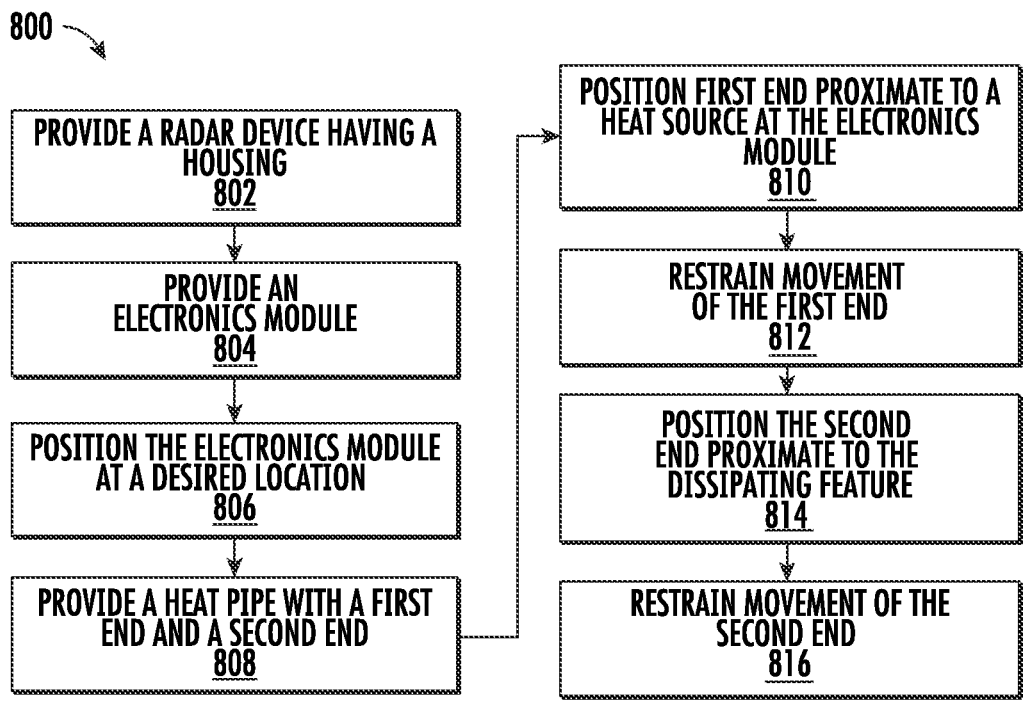

Having thus described the invention in general terms, reference will now be made to the accompanying drawings, which are not necessarily drawn to scale, and wherein:

FIG. 1A illustrates a perspective view of an example radar device, in accordance with some embodiments discussed herein;

FIG. 1B illustrates a perspective view of an electronics module and other components, such as for use in the example radar device shown in FIG. 1A, in accordance with some embodiments discussed herein;

FIG. 2A illustrates a perspective view of an example housing that may be used with a radar device, in accordance with some embodiments discussed herein;

FIG. 2B illustrates a cross-sectional view of the example housing of FIG. 2A about the line A'-A', in accordance with some embodiments discussed herein;

FIG. 2C illustrates an enhanced view of the cross-section of the example housing illustrated in FIG. 2B where an example heat pipe is shown, in accordance with some embodiments discussed herein;

FIG. 3 illustrates a cross-sectional view of an example heat pipe and other components within an example housing, in accordance with some embodiments discussed herein;

FIG. 4A illustrates a cross-sectional view of an example housing where multiple heat pipes are utilized, in accordance with some embodiments discussed herein;

FIG. 4B illustrates the underside of an example electronics module, in accordance with some embodiments discussed herein;

FIG. 5 illustrates a perspective view of an example housing where multiple heat pipes are utilized and where certain components are hidden, in accordance with some embodiments discussed herein;

FIG. 6A illustrates another cross-sectional view of an example housing where multiple heat pipes are utilized and where the heat pipes are bent, in accordance with some embodiments discussed herein;

FIG. 6B illustrates an enhanced view of an example housing where multiple heat pipes are utilized and where the heat pipes are bent, in accordance with some embodiments discussed herein;

FIG. 7 illustrates a schematic view of one example heat pipe, in accordance with some embodiments discussed herein; and FIG. 8 illustrates an example method for making a housing that utilizes a heat pipe, in accordance with some embodiments discussed herein.

DETAILED DESCRIPTION

Example embodiments of the present invention now will be described more fully hereinafter with reference to the accompanying drawings, in which some, but not all embodiments of the invention are shown. Indeed, the invention may be embodied in many different forms and should not be construed as limited to the example embodiments set forth herein; rather, these embodiments are provided so that this disclosure will satisfy applicable legal requirements. Like reference numerals refer to like elements throughout. Additionally, any connections or attachments may be direct or indirect connections or attachments unless specifically noted otherwise.

In various embodiments, a radar device may be utilized that has improved heat dissipation, preventing overheating of features within the radar device. FIG. 1A illustrates a perspective view of an example radar device 100, in accordance with some embodiments discussed herein. The radar device 100 may include a housing 102 and an antenna 104. Various features of the radar device 100 are described in greater detail in reference to subsequent figures. In some embodiments, this antenna 104 may be configured to rotate relative to other components of the radar device 100. For example, the antenna 104 may be configured to rotate relative to the electronics module 108 (see FIG. 1B). For example, the antenna 104 may be connected to a rotary joint in the housing 102.

Other components that may be provided inside the housing are illustrated in FIG. 1B. FIG. 1B illustrates a perspective view of an electronics module 108 and other components. A secondary module 107 and a waveguide assembly 120 may also be provided. The electronics module 108 may be provided as a metallic case in some embodiments. In some embodiments, the secondary module 107 and/or the electronics module 108 may be temporarily laterally displaced (e.g., along an air gap in the waveguide assembly 120) to increase ease in maintenance. The direction of lateral displacement is indicated by the arrows at the periphery of FIG. 1B. In some embodiments, a motor may be provided to cause movement of the electronics module 108. In some embodiments, one or more tabs (see, e.g., 218, FIG. 2C) may be provided in the electronics module 108 to limit movement of the electronics module 108. After the electronics module 108 has moved a certain amount along the path indicated by the arrows, the tab(s) may engage another component to prevent further movement of the electronics module 108. Additionally, in some embodiments, maintenance is easier to perform because features of the radar device 100 (see FIG. 1) may be removed without having to detach the two components of the waveguide assembly 120 (as they are already separated by the air gap). Example waveguide assemblies are described in U.S. Non-Provisional application Ser. No. 17/537,781, entitled "Radar Waveguide and Choke Assembly", filed Nov. 30, 2021, the teachings of which are hereby incorporated by reference in its entirety. While some embodiments discussed herein utilize waveguide assemblies having two components separated by an air gap, other embodiments may not include such waveguide assemblies.

FIGS. 2A-2C illustrate the housing and other components within the housing in greater detail. FIG. 2A illustrates a perspective view of an example housing 202 that may be used with a radar device 100 (see FIG. 1A). A mount 203 may be provided, and this mount 203 may be configured to receive and secure an antenna 104 (see FIG. 1A). A channel 206 may extend to the mount 203, and this channel 206 may be configured to transfer radio-frequency power to or from an antenna 104 (see FIG. 1A) secured to the mount 203.

Turning now to FIG. 2B, a cross-sectional view may be seen of the example housing 202 of FIG. 2A about the line A'-A'. The housing 202 may have an exterior wall 222 as illustrated. This exterior wall 222 may serve as a dissipating feature, but other possible dissipating features may also be used. An electronics module 208, a secondary module 207, and a waveguide assembly 220 may also be provided inside the housing 202. As noted herein, various electrical components may be provided on the electronics module 208, generating a significant amount of heat in the electronics module 208.

Looking now at FIG. 2C, an enhanced view is illustrated of the cross-section of the example housing 202 depicted in FIG. 2B where an example heat pipe 210 may be seen. This heat pipe 210 may assist in reducing the amount of heat at the electronics module 208. The heat pipe 210 may have a first end 250 and a second end 252. In some embodiments, the heat pipe 210 may be an evaporator-condenser heat pipe. Further details regarding such an evaporator-condenser heat pipe are provided in FIG. 8 and the corresponding discussion herein.

In some embodiments, the second end 252 of the heat pipe 210 may be positioned adjacent to a first dissipating feature, and heat may transfer from the second end 252 of the heat pipe 210 to the first dissipating feature. This first dissipating feature may then further dissipate the heat. In some embodiments, this first dissipating feature may be the exterior wall of the housing, but other first dissipating features may be used. For example, the first dissipating feature may be positioned at a location within the housing 202, such as a position at the edge of the electronics module 208, at a location outside of the housing 202, or at a fan unit located in the housing 202.

In some embodiments, a mounting plate 216 may be connected to the exterior wall 222 of the housing 202. The mounting plate 216 may serve multiple purposes. First, the mounting plate 216 may be used to assist in restraining the movement of the heat pipe 210. The second end 252 of the heat pipe 210 may be positioned adjacent to the mounting plate 216 as illustrated in FIG. 2C, and then a clamp 214 may be used to restrain the movement of the second end 252 of the heat pipe 210. The clamp 214 may have horizontally extending holes 215, and these horizontally extending holes 215 may be threaded holes that are configured to receive fasteners, such as screws. The mounting plate 216 may also assist in the positioning of electronics module 208 relative to the housing 202. In some embodiments, a tab 218 may extend from the upper surface of the electronics module 208, and the tab 218 may be configured to contact the mounting plate 216 to assist in positioning the electronics module 208 relative to the housing 202. For example, the electronics module 208 may be permitted to shift laterally within the housing 202 until the tab 218 comes in contact with the mounting plate 216.

In some embodiments, the first end 250 of the heat pipe 210 may be provided proximate to a heat source, and the second end 252 of the heat pipe 210 may be provided adjacent to a first dissipating feature at a distance away from the heat source. For example, the second end 252 of the heat pipe 210 may be provided proximate to a first dissipating feature, which may be in the form of the exterior wall 222 of the housing 202. In some embodiments, the second end 252 of the heat pipe 210 may be attached to the first dissipating feature. In this way, heat may be transferred from the first end 250 to the second end 252 of the heat pipe 210, and heat may then be transferred from the second end 252 of the heat pipe 210 to the first dissipating feature. Once heat has reached the first dissipating feature (e.g. the exterior wall 222), the heat may disperse from the first dissipating feature towards the external environment. Where the first dissipating feature is the exterior wall 222, ambient air from the external environment may also cool the exterior wall 222. Where the first dissipating feature is provided at a location other than the exterior wall 222, heat may transfer from the first dissipating feature towards the external environment, moving through the exterior wall in the process.

The first end 250 of the heat pipe 210 may be provided proximate to a wide variety of heat sources. In some instances, it may be beneficial to simply provide the first end 250 at any location within the housing 202 in order to manage the amount of heat within the housing 202. In other embodiments, the first end 250 may be provided proximate to at least one of a power amplifier 441 (see FIG. 4B), a waveguide assembly 220, a printed circuit board (PCB), a motor, or another electronic component. The first end 250 may be placed proximate to multiple heat sources in some embodiments.

Providing the first end 250 of the heat pipe 210 at a lower elevation than the second end 252 of the heat pipe 210 may be beneficial in some embodiments. The surrounding temperature at the first end 250, which may be placed proximate to a heat source, may be higher than the surrounding temperature at the second end 252. By placing the second end 252 at a higher elevation than the first end 250, heat may be transferred more efficiently through the heat pipe 210 from the first end 250 to the second end 252. Doing so may assist in the capillary action within an evaporator-condenser heat pipe where such a heat pipe is used.

As illustrated, the heat pipe 210 may extend through a cavity 246 within an attachment member 240. The attachment member 240 may be positioned above a power amplifier 441 (see FIG. 4B), which may be positioned on the underside of the electronics module 208. In some embodiments, the heat source such as the power amplifier 441 may be coupled directly to the attachment member 240 instead of being coupled to a PCBA or electronics module 208. The attachment member 240 may comprise a conductive material such as a metal. The power amplifier 441 may be a radio frequency power amplifier, and the power amplifier 441 itself may be provided on a radio frequency printed circuit board. The power amplifier 441 may be a serve as a major heat source, and the use of the heat pipe 210 may allow for effective heat management, easy installation, and easy maintenance. The power amplifier 441 may frequently be located adjacent to the waveguide assembly 220 to optimize the performance of the power amplifier 441, and these components will typically be located in a central location within the housing 202. At this central location, these heat sources are at a significant distance away from the exterior wall 222 of the housing 202, making it difficult to manage the amount of heat at this location without the assistance of a heat pipe or some other heat management approach.

Without the use of any heat management approaches such as a heat pipe, heat from heat generating components at the electronics module 208 would move by conduction through the electronics module 208 towards the exterior wall 222 of the housing 202 at a relatively low rate of effectiveness. While heat would slowly transfer to the exterior wall 222 and to the external environment, a significant amount of heat would remain concentrated proximate to heat sources on the electronics module. Further, poor thermal path routing may occur in the electronics module 208, with heat being concentrated at higher levels in some locations on the electronics module 208.

The heat pipe 210 may be provided proximate to heat sources to better control the heat level at these heat sources. The heat pipe 210 may be easily installed or removed for maintenance using a clamp 244. The clamp 244 may have vertically extending holes 217, and these holes 217 may be threaded holes that are configured to receive fasteners such as screws. However, in other embodiments, a clamp may be provided that is configured to secure the heat pipe 210 to the side of the attachment member 240, and the clamp may have horizontally extending holes or holes extending at other angles.

FIG. 3 illustrates a cross-sectional view of an example heat pipe 310 and other components within an example housing 302. As illustrated by the arrows at the bottom of FIG. 3, the electronics module 308 may be shifted laterally so that maintenance may be easily performed on the heat pipe 310, electronics at the electronics module 308, or other components. With the electronics module 308 in the position illustrated in FIG. 3, a tab 318 is abutting the mounting plate 316, and this restricts the movement of the electronics module 308 (e.g., further into the housing 302). Once in this position, fasteners may be used to secure the electronics module 308 in place. Notably, the fasteners may be installed horizontally (which is useful for installation in a tight space) as the mounting plate 316 extends downward vertically.

Heat transfers from the first end 350 of the heat pipe 310 to the second end 352 of the heat pipe 310. Then, heat transfers from the second end 352 of the heat pipe 310 to the first dissipating feature. Here, the first dissipating feature is the exterior wall 322 of the housing 302. Once heat has transferred to the first dissipating feature, heat may be transferred towards the external environment. Thus, the heat pipe 310 may effectively reduce the amount of heat located at the heat source(s).

As noted above, the heat pipe 310 may be placed in the desired position and then secured in place. For example, the first end 350 is provided proximate to the waveguide assembly 320 and the power amplifier 441 (see FIG. 4B) in the embodiment illustrated in FIG. 3. The first end 350 of the heat pipe 310 may be secured in place using an attachment member 340 and a clamp 344 having vertically extending holes 317, and the second end 352 of the heat pipe 310 may be secured in place using a clamp 314 having horizontally extending holes 315.

In previous embodiments, the illustrated housings possess only one heat pipe, but two or more heat pipes may be used in some embodiments to further manage the heat within the housing. FIG. 4A illustrates a cross-sectional view of an example housing 402 where multiple heat pipes are utilized. As illustrated, a first heat pipe 410A and a second heat pipe 410B may be provided.

The first heat pipe 410A may be positioned and secured similar to the heat pipe 210 illustrated in FIG. 2C. The first heat pipe 410A may be secured adjacent to a first dissipating feature, which may be in the form of a first location on the exterior wall. This may be accomplished by positioning an end of the first heat pipe 410A adjacent to a first mounting plate 416A and then securing that end of the first heat pipe 410A to the first mounting plate 416A using a first clamp 414A and screws 417A. The first heat pipe 410A may also be secured proximate to the power amplifier 441 (see FIG. 4B) or to another heat source, and this first heat pipe 410A may be secured to an attachment member 440 using screws 415A. The second heat pipe 410B may be positioned and secured in a similar manner. The second heat pipe 410B may be secured adjacent to a second dissipating feature, which may be in the form of a second location on the exterior wall. This second location may be located on an opposite side of the exterior wall relative to the first location. The second heat pipe 410B may be positioned adjacent to the second mounting plate 416B and then secured to the second mounting plate 416B using a second clamp 414B and screws 417A.

Both the first heat pipe 410A and the second heat pipe 410B may have one end that is positioned proximate to a heat source near the electronics module 408. The heat source may be a power amplifier 441 (see FIG. 4B) or a waveguide assembly 420 in some embodiments. In the illustrated embodiment, the attachment member 440 is positioned above the power amplifier 441, the first heat pipe 410A is positioned above the top surface of the attachment member 440, and the second heat pipe 410B is positioned at a side surface of the attachment member 440.

While two heat pipes are illustrated in FIG. 4A extending to a power amplifier, additional heat pipes may be used in other embodiments. Additional heat pipes may extend at various angles to the power amplifier to further manage the amount of heat at the power amplifier. Additionally, the heat pipes may also extend to heat sources at other locations on the electronics module or to other locations within the housing. For example, some heat pipes may extend from the power amplifier to the exterior wall while other heat pipes may extend from the waveguide assembly or other electronic components to the exterior wall. Further, the first dissipating feature and the second dissipating feature may be provided at a variety of locations other than the exterior wall of the housing.

FIG. 4B illustrates the underside of an example electronics module 408. As illustrated, at least a portion of the power amplifier 441 may extend to the underside of the electronics module 408. The heat pipes described herein may assist in managing the heat at these locations as well by reducing the amount of heat that transfers by conduction through the electronics module 408. By doing so, the risk of damage to electrical components on the underside of the electronics module 408 may be reduced.

FIG. 5 illustrates a perspective view of another example housing 502 where multiple heat pipes are utilized. Certain components such as clamps are hidden to allow other components to be seen more easily. As illustrated, a first heat pipe 510A and a second heat pipe 510B are provided. These heat pipes may transfer heat from heat sources to dissipating features. Here, the dissipating features are locations on the exterior wall. Additionally, the housing 502 may include an exterior wall 522, and a first mounting plate 516A and a second mounting plate 516B may be connected to the exterior wall 522. One end of the first heat pipe 510A may extend to a first mounting plate 516A where the first heat pipe 510A may be secured to the first mounting plate 516A, and one end of the second heat pipe 510B may extend to a second mounting plate 516B where the second heat pipe 510B may be secured to the second mounting plate 516B. As illustrated in FIG. 5, the first heat pipe 510A and the second heat pipe 510B may be configured to transfer heat to opposite sides of the housing 502. The first heat pipe 510A and the second heat pipe 510B may both extend to a heat source located at the electronics module 508. This heat source may, for example, be a waveguide assembly 520 and/or the power amplifier 441 (see FIG. 4B), but the heat pipes may be used to manage heat from other heat sources. In some embodiments, an attachment member 540 may be positioned above the power amplifier 441 (see FIG. 4B), and the first heat pipe 510A and the second heat pipe 510B may be secured to the attachment member 540. A first tab 518A may be used to position the electronics module 508 relative to the first mounting plate 516A, and a second tab 518B may be used to position the electronics module 508 relative to the second mounting plate 516B during assembly or maintenance.

FIG. 6A illustrates another cross-sectional view of an example housing 602 where multiple heat pipes are utilized and where the heat pipes are bent. As illustrated, a first heat pipe 610A' and a second heat pipe 610B' are provided. In this embodiment, the second heat pipe 610B' is bent, with a first section 624 extending at a different angle compared to a second section 626. By providing heat pipes having different shapes, the heat pipes may be used within various types of radar devices. Varying geometries may be beneficial to accommodate radar devices with components that are densely packed or to reach different heat sources such as the power amplifier 441 (see FIG. 4B). In FIG. 6A, the heat pipes extend to an attachment member 640 positioned above the power amplifier 441.

FIG. 6B illustrates an enhanced view of an example housing where multiple heat pipes are utilized and where the heat pipes are bent. In this embodiment, the first heat pipe 610A' and the second heat pipe 610B' may both be secured above the attachment member 640, and a clamp 644 may be used to secure an end of the heat pipes in place. This clamp 644 may have vertically extending holes 617 that may be threaded, and fasteners such as screws may be used to secure the clamp 644 in position. The first heat pipe 610A' may extend into a first cavity 646 of the attachment member 640, and the second heat pipe 610B' may extend into a second cavity 648 of the attachment member 640. In some embodiments, the heat pipes may be positioned proximate to other heat sources at the electronics module 608 such as the waveguide assembly 620, PCBs, or other electronics.

FIG. 7 illustrates a schematic view of one example heat pipe 710. This heat pipe 710 is an evaporator-condenser heat pipe. The heat pipe 710 may have an impermeable wall 728. A porous wick 730 may be provided inside the impermeable wall 728, and a cavity 732 may be provided inside the porous wick 730. Additionally, the heat pipe 710 may have a first end 734, a second end 738, and a middle section 736 between the two ends. The middle section 736 may be configured so that it is adiabatic, but the first end 734 may be configured to receive heat from the surrounding environment and the second end 738 may be configured to release heat into the surrounding environment.

The first end 734 may be placed proximate to a heat source so that the first end 734 serves as an evaporator for fluids in the heat pipe 710. Liquid material in the porous wick 730 that is located at the first end 734 may evaporate and turn into vapor, and this vapor may flow into the cavity 732. Once in the cavity, the vapor may flow from left to right, moving from the first end 734, through the middle section 736, and all the way to the second end 738. The second end 738 may be placed away from the heat source so that the second end 738 has a lower temperature than the first end 734. The second end 738 may serve as a condenser for vapor located in the cavity 732 at the second end 738 of the heat pipe 710. Thus, the vapor at this location may be converted to a liquid, and this liquid may move to the porous wick 730. Once in the porous wick, the liquid may then move from right to left, moving from the second end 738, through the middle section 736, all the way to the first end 734. This cycle occurs repetitively.

Heat pipes of various sizes may be used. The size of the heat pipe may be selected to accommodate the design of a radar device being used. For example, a wide variety of diameters may be used. In some embodiments, a heat pipe having a diameter ranging from 3 millimeters to 12 millimeters may be used. In some embodiments, a heat pipe having a diameter ranging from 4 millimeters to 10 millimeters may be used. In another embodiment, a heat pipe having a 8 millimeter diameter may be used. Additionally, the length of the heat pipe may be selected to accommodate the geometry of the housing and its internal components. Where a heat pipe having a 8 millimeter diameter is used, the expected heat transfer may range from 25 watts to 45 watts. In some embodiments, heat pipes may reduce the temperature at a heat source by 10 degrees Celsius or more as compared to systems without a heat pipe. However, the amount of temperature reduction may vary depending on the size of the heat pipe, the size of the radar device, and the difference in temperature at the two ends of the heat pipe. Heat pipes having different cross sections may be used as well. For example, non-round heat pipes may be used having a flat-rectangular cross section, or other heat pipes may be used with non-symmetrical cross sections.

Some embodiments allow for easy assembly and disassembly, with parts such as the electronics module and the heat pipe being easily installed or disassembled. FIG. 8 illustrates an example method 800 for making a radar device having heat pipes. Various components may be provided. For example, at operation 802, a housing may be provided. In some embodiments, the housing may include an antenna. Additionally, an electronics module may be provided at operation 804.

At operation 806, the electronics module may be positioned at a desired location. In some embodiments, this may be accomplished through the use of a tab on the electronics module as well as a mounting plate attached to the exterior wall of the housing. In some embodiments, a tab extending from the upper surface of an electronics module may be configured to contact a mounting plate to assist in positioning the electronics module relative to the housing. The electronics module may be shifted until the tab comes into contact with the mounting plate, and this contact may restrict any further movement of the electronics module.

In some embodiments, a motor may be provided to cause movement of the electronics module. After the electronics module has moved a certain amount along the path indicated by the arrows, the tab may engage another component to prevent further movement of the electronics module. Maintenance may be made easier to perform by permitting the electronics module to be easily removed. Further, a waveguide assembly may be provided having two components separated by an air gap, and this may allow for easy maintenance of the waveguide assembly and other components on the electronics module without having to detach the components of the waveguide assembly.

At operation 808, a heat pipe may be provided, and this heat pipe has a first end and a second end. At operation 810, the first end of the heat pipe may be positioned proximate to a heat source. In some embodiments, this heat source may simply be located in the housing or at a position on the electronics module. This heat source may be a power amplifier, a waveguide assembly, a printed circuit board (PCB), a motor, or other electronic components in some embodiments. However, the first end may be placed proximate to other heat sources as well.

The movement of the first end of the heat pipe may be restrained at operation 812. This may be done by securing the first end to the electronics module or to another component at operation 812. This may be accomplished using a clamp and/or a magnetic member. This securement may also be accomplished through brazing and/or soldering. The use of a clamp may be beneficial to permit easy assembly and disassembly.

At operation 814, the second end of the heat pipe is positioned adjacent to a dissipation feature, and this dissipation feature may be located away from the heat source. The second end of the heat pipe will preferably be placed at a location having a substantially lower surrounding temperature than the first end of the heat pipe. In some embodiments, the second end may be positioned proximate to an exterior wall of the housing. As discussed above, the second end of the heat pipe may be provided adjacent to a mounting plate that is connected to an exterior wall of the housing in some embodiments. Additionally, the second end of the heat pipe may be positioned so that it is above the first end of the heat pipe. By elevating the second end of the heat pipe, heat may be transferred more effectively in the heat pipe.

At operation 816, the movement of the second end is restrained. This may be accomplished by using a clamp having horizontally extending holes, with the holes being threaded so that fasteners such as screws may secure the clamp and the heat pipe in place.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the invention. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the invention. In this regard, for example, different combinations of elements and/or functions than those explicitly described above are also contemplated within the scope of the invention. Although specific terms are employed herein, they are used in a generic and descriptive sense only and not for purposes of limitation.

That which is claimed:

1. A radar device comprising:
   an antenna;
   a housing having an exterior wall;
   an electronics module having a heat source, wherein the electronics module is enclosed within the housing, wherein the antenna is configured to rotate relative to the electronics module; and
   a heat pipe having a first end and a second end,
   wherein, when the electronics module is installed within the housing, the first end of the heat pipe is attached to the electronics module and is positioned proximate to the heat source and the second end of the heat pipe is positioned proximate a first dissipating feature, wherein the heat pipe is configured to transfer heat from the first end of the heat pipe to the second end of the heat pipe to reduce an amount of heat at the heat source, and wherein the second end of the heat pipe is configured to transfer heat to the first dissipating feature,
   wherein the housing is configured to permit the electronics module to shift laterally within the housing to install the electronics module therein such that the second end of the heat pipe is positioned adjacent a mounting plate to permit heat transfer from the second end of the heat pipe to the mounting plate for further heat transfer to the first dissipating feature.

2. The radar device of claim 1, wherein the heat pipe is an evaporator-condenser heat pipe.

3. The radar device of claim 1, wherein the first dissipating feature is the exterior wall of the housing.

4. The radar device of claim 3, wherein the mounting plate is configured to assist in securing the heat pipe.

5. The radar device of claim 4, wherein the electronics module has a top surface and a tab extending from the top surface, wherein the tab is configured to contact the mounting plate to assist in positioning the electronics module relative to the housing during installation of the electronics module.

6. The radar device of claim 5, wherein the housing is configured to permit the electronics module to shift laterally within the housing until the tab contacts the mounting plate.

7. The radar device of claim 1, wherein the heat source includes at least one of a power amplifier, a waveguide assembly, a printed circuit board, or a motor.

8. The radar device of claim 1, wherein the first end of the heat pipe is provided at a lower elevation than the second end of the heat pipe.

9. The radar device of claim 1, wherein a second heat pipe is provided.

10. The radar device of claim 9, wherein the heat pipe is a first heat pipe, wherein the second heat pipe has a first end and a second end, wherein the first end is positioned proximate the heat source and the second end is positioned proximate a second dissipating feature on an opposite side of the housing as the second end of the first heat pipe.

11. The radar device of claim 1, further comprising a waveguide assembly having a first component and a second component, wherein an air gap is defined between the first component and the second component, wherein the second component of the waveguide assembly is attached to the electronics module, wherein the first component of the waveguide assembly is configured to rotate with the antenna relative to the electronics module.

12. The radar device of claim 1, wherein the heat pipe is secured through brazing, through soldering, or by using at least one of a clamp or a magnet.

13. The radar device of claim 1, wherein the radar device is made by a process of:
   providing the housing;
   providing the electronics module with the heat pipe;
   positioning the electronics module at a desired location by positioning the first end of the heat pipe proximate to the heat source and positioning the second end of the heat pipe proximate to the first dissipating feature; and
   restraining movement of the second end of the heat pipe.

14. A radar device comprising:
   an antenna;
   a heat source;
   a heat pipe that is configured to transfer heat from a first end of the heat pipe to a second end of the heat pipe to reduce an amount of heat at the heat source;
   a housing having an exterior wall and a plate connected to the exterior wall;
   an electronics module having a tab, wherein the antenna is configured to rotate relative to the electronics module, wherein the first end of the heat pipe is attached to the electronics module, and
   wherein the housing is configured to permit the electronics module to shift laterally within the housing until the tab contacts the plate, wherein the tab is configured to contact the plate to assist in positioning the electronics module relative to the housing so as to position the first end of the heat pipe proximate the heat source and the second end of the heat pipe adjacent the plate for attachment thereto.

15. The radar device of claim 14, further comprising a waveguide assembly having a first component and a second component, wherein an air gap is defined between the first component and the second component, wherein the second component of the waveguide assembly is attached to the electronics module, wherein the first component of the waveguide assembly is configured to rotate with the antenna relative to the electronics module.

16. The radar device of claim 14, wherein the electronics module has a top surface, wherein the tab extends from the top surface.

17. The radar device of claim 16, wherein the electronics module includes two or more tabs.

* * * * *